United States Patent [19]
Park et al.

[11] Patent Number: 5,831,284
[45] Date of Patent: Nov. 3, 1998

[54] LIQUID CRYSTAL DISPLAY UNIT HAVING A CAPACITOR AND METHOD OF MANUFACTURING SAME

[75] Inventors: Jae-Yong Park; In-Woo Kim, both of Kyungki-do, Rep. of Korea

[73] Assignee: LG Electronics Inc., Seoul, Rep. of Korea

[21] Appl. No.: 715,591

[22] Filed: Sep. 18, 1996

[30] Foreign Application Priority Data

Jan. 10, 1996 [KR] Rep. of Korea ................... 1996/00374

[51] Int. Cl.⁶ .......................... H01L 27/108; H01L 29/04; H01L 29/76; H01L 31/036
[52] U.S. Cl. ................. 257/68; 257/71; 257/296; 257/301; 257/311
[58] Field of Search ................. 257/68, 71, 296, 257/301, 311

[56] References Cited

U.S. PATENT DOCUMENTS 3,862,360  1/1975  Doll et al. .
5,648,663  7/1997  Kitahara et al. ................ 257/59

*Primary Examiner*—Ngân V. Ngô
*Attorney, Agent, or Firm*—Morgan, Lewis & Bockius LLP

[57] ABSTRACT

A storage capacitor for use in a liquid crystal display and a method of manufacturing the capacitor are disclosed. The storage capacitor includes a first electrode on a substrate. Then, a first insulating layer is formed over the first electrode. The capacitor also includes a second insulating layer immediately over the first insulating layer. The second insulating layer is formed to have a recess above the first electrode. This recess may extend through the second insulating layer as to expose the first insulating layer. The capacitor further includes a second electrode over the second insulating layer including the recess.

26 Claims, 4 Drawing Sheets

LIQUID CRYSTAL DISPLAY UNIT HAVING A CAPACITOR AND METHOD OF MANUFACTURING SAME

BACKGROUND OF THE INVENTION

1. Field of the Invention

The present invention relates to a semiconductor device, and more particularly to a liquid crystal display unit and method of manufacturing the same.

2. Discussion of the Related Art

In a semiconductor device, capacitance C of a storage capacitor is represented by:

$$C = \epsilon_0 \epsilon_r \frac{S}{d} \qquad (1)$$

where, $\epsilon_0$ is the permittivity of free space and $\epsilon_r$ is the dielectric constant of a insulating material, S is the area of the storage capacitor, and d is the distance between upper and lower electrodes. As is apparent from the above equation (1), capacitance C is proportional to dielectric constant $\epsilon_r$ of the insulating material and area S of the storage node, and inversely proportional to distance d between the upper and lower electrodes. With high integration, the area occupied by a transistor is reduced and therefore the capacitance of the storage capacitor becomes small.

FIGS. 1a to 1d show a conventional manufacturing process of a liquid crystal display unit. As shown in FIG. 1a, a metal layer is deposited on a glass substrate 1. The metal layer is selectively removed by a photolithographic and etching process to form a capacitor lower electrode 2a and a gate electrode 2. The gate electrode 2 and the capacitor lower electrode 2a are subject to anodic oxidation which forms anodic oxide layers 3 and 4 on the surface thereof.

As shown in FIG. 1b, an $Si_3N_4$ or an $SiO_2$ layer is deposited on the whole surface of the glass substrate 1 including the anodic oxide layers 3 and 4 to form a gate insulating layer 5. An amorphous silicon layer 6 is deposited on the gate insulating layer 5 and selectively removed through the photolithographic process to define an active region.

Next, as shown in FIG. 1c, a metal layer is deposited on the whole surface of the glass substrate 1 and selectively removed to form a source/drain electrode 7. A transistor 100 for the liquid crystal display unit is thus formed.

As shown in FIG. 1d, a passivation layer 8, for example, a $Si_3N_4$ or $SiO_2$ layer, is deposited on the whole surface of the substrate 1, and selectively etched to form a contact hole and exposing a portion of the drain electrode 7. Then, an ITO layer is deposited on the whole surface of the substrate 1 and patterned to form a pixel electrode 9. The pixel electrode 9 is electrically connected to the drain electrode 7 through the contact hole. The pixel electrode 9 is formed so as to overlap the capacitor lower electrode 2a. A storage capacitor 200 of the liquid crystal display unit is thus formed.

However, the conventional manufacturing process of the liquid crystal display unit has a disadvantage in that it is difficult to increase the capacitance of the storage capacitor. This is because two insulating layers are formed between the capacitor lower electrode and the pixel electrode. The capacitance of a capacitor is inversely proportional to the distance between the upper and lower electrodes. Therefore, the conventional manufacturing process for the liquid crystal display unit is not suitable for high integration of semiconductor devices.

SUMMARY OF THE INVENTION

Accordingly, the present invention is directed to a method of manufacturing a liquid crystal display unit that substantially obviates one or more of the problems due to limitations and disadvantages of the related art.

An object of the present invention is to provide a liquid crystal display unit and method for increasing the capacitance of a storage capacitor making it suitable for a high integration device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing a liquid crystal display unit having a thin film transistor and a storage capacitor comprises the steps of forming a gate electrode and a storage electrode on a substrate; forming a first insulating layer over a first overall surface of the substrate; forming a second insulating layer on the first insulating layer; forming a semiconductor layer on the second insulating layer above the gate electrode; forming source and drain electrodes at sides of the semiconductor layer; forming a third insulating layer over a second overall surface of the substrate; selectively etching the third and second insulating layers to form first and second contact holes, the first contact hole exposing a portion of the drain electrode and the second contact hole exposing a portion of the first insulating layer above the storage electrode; and forming a pixel electrode over the third insulating layer including the first and second contact holes.

In another aspect, the present invention provides a method of manufacturing a liquid crystal display unit having a thin film transistor and a storage capacitor comprising the steps of forming a gate electrode and a storage electrode on a substrate; forming a first insulating layer over an overall surface of the substrate; forming a second insulating layer on the first insulating layer; forming a semiconductor layer on the second insulating layer above the gate electrode; forming source and drain electrodes at sides of the semiconductor layer; selectively etching the second insulating layer to form a contact hole, the contact hole exposing a portion of the first insulating layer above the storage electrode; and forming a pixel electrode on the second insulating layer including the contact hole.

In another aspect, the present invention provides a method of manufacturing a liquid crystal display unit having a thin film transistor and a storage capacitor comprising the steps of forming a gate electrode and a storage electrode on a substrate; forming a first insulating layer over an overall surface of the substrate; forming a second insulating layer on the first insulating layer; forming a semiconductor layer on the second insulating layer above the gate electrode; selectively etching the second insulating layer to form a contact hole, the contact hole exposing a portion of the first insulating layer above the storage electrode; forming a pixel electrode on the second insulating layer including the contact hole; and forming source and drain electrodes at sides of the semiconductor layer.

In another aspect, the present invention provides a method of manufacturing a storage capacitor having first and second storage electrodes comprising the steps of forming the first storage electrode on a substrate; forming a first insulating layer over an overall surface of the substrate; forming a second insulating layer on the first insulating layer; etching the second insulating layer to form a recess above the first electrode; and forming the second storage electrode on the second insulation layer and filling the recess.

In another aspect, the present invention provides a capacitor for a liquid crystal display having a substrate comprising a first electrode on the substrate; a first insulating layer over the first electrode; a second insulating layer over the first insulating layer, the second insulating layer having a recess above the first electrode; and a second electrode over the second insulating layer including the recess.

In another aspect, the present invention provides a capacitor for a liquid crystal display having a substrate comprising a first electrode on the substrate; a first insulating layer over the first electrode; a second insulating layer over the first insulating layer; a third insulating layer over the second insulating layer, the second and third insulating layers having a hole above the first electrode; and a second electrode over the third insulating layer including the hole.

In another aspect, the present invention provides a liquid crystal display including a transistor and a capacitor comprising a substrate; a gate electrode and a first capacitor electrode on the substrate; a first insulating layer over the gate and the first capacitor electrode; a second insulating layer over the first insulating layer; a semiconductor layer on the second insulating layer above the gate electrode; source and drain electrodes over the semiconductor layer; a third insulating layer having a first hole over the source and drain electrodes and the second insulating layer, the second and third insulating layers having a second hole above the first capacitor electrode; a pixel electrode over the third insulating layer and contacting one of the source and drain electrodes through the first hole; and a second capacitor electrode over the third insulating layer including the second hole, the second capacitor electrode connected to the pixel electrode.

In a further aspect, the present invention provides a method of manufacturing a liquid crystal display unit including the steps of preparing a substrate, forming a gate electrode and a capacitor lower electrode on the substrate, forming an anodic oxide layer on the exposed surface of the gate electrode and of the capacitor lower electrode, forming first and second insulating layers on the exposed surface of the substrate including the anodic oxide layer, forming a semiconductor layer on the second insulating layer formed over the gate electrode, forming source and drain electrodes at both sides on the semiconductor layer, forming a third insulating layer on the exposed surface of the semiconductor layer and of the second insulating layer including the source and drain electrodes, forming first and second contact holes by selectively removing the insulating layer and the second gate insulating layer so as to expose a portion of the drain electrode and of the first insulating layer formed over the capacitor lower electrode, and forming a pixel electrode on the third insulating layer including the first and second contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

Referring to FIG. 2 and FIGS. 3a to 3d, a first embodiment of the present invention will be described below.

Figure 1A:
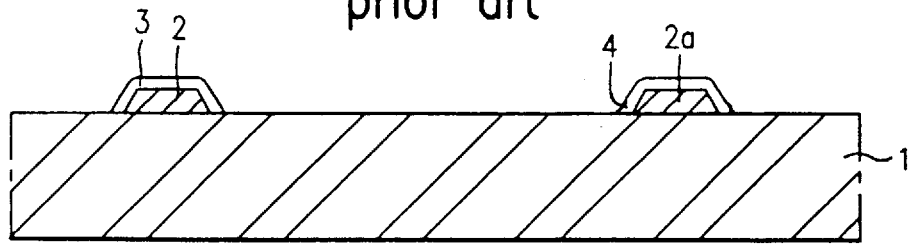
FIGS. 1a to 1d are sectional views showing a conventional manufacturing process of a liquid crystal display unit.
Figure 1B:
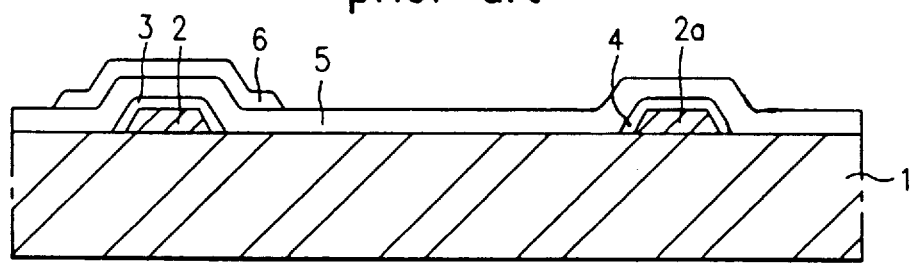
Figure 1C:
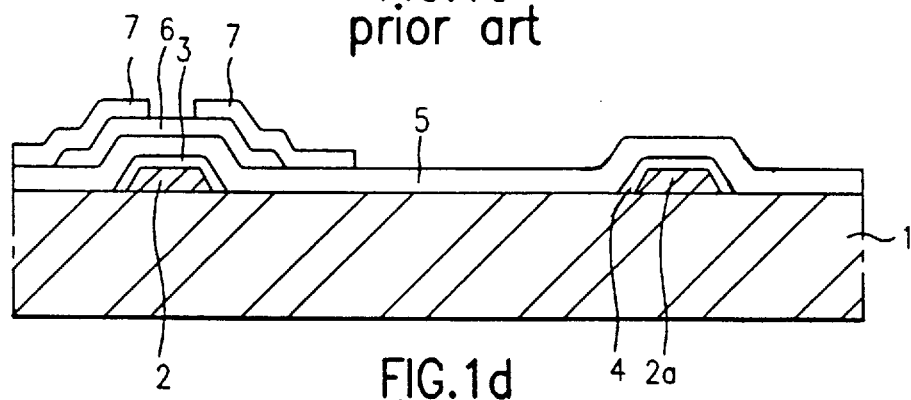
Figure 1D:
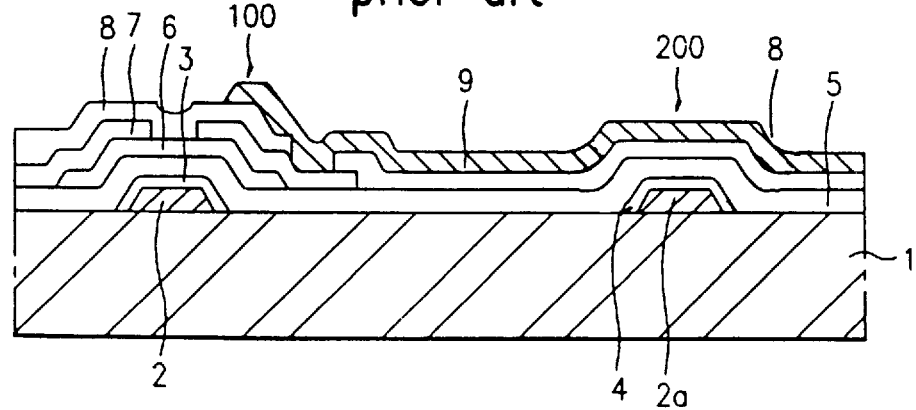
Figure 2:
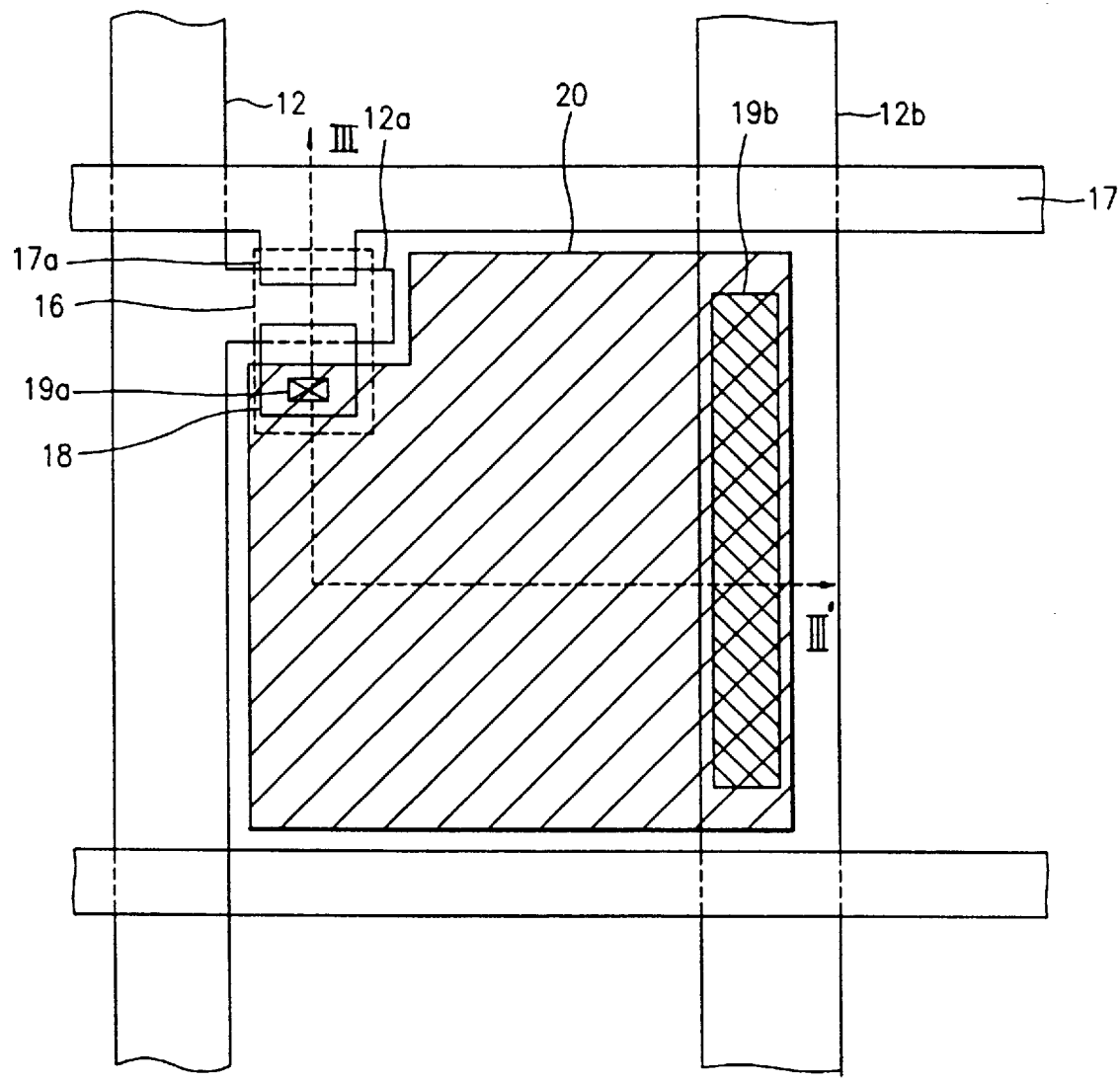
FIG. 2 is a layout of a liquid crystal display unit according to a first embodiment of the present invention.

FIG. 2 is a layout of a liquid crystal display unit according to the first embodiment of the present invention. As shown in FIG. 2, a gate line 12 overlaps a data line 17. The gate and data lines 12 and 17 supply a driving signal and a data signal to a pixel, respectively. A pixel electrode 20 is formed at a pixel region surrounded by the gate line 12 and the data line 17. A gate electrode 12a is formed at the same time the gate line 12 is formed. Source electrode 17a and drain electrode 18 are formed at the same time the data line 17 is formed. A signal on the gate line 12 turns on a thin film transistor and transfers a signal from the data line 17 to the pixel electrode 20. The pixel electrode 20 is also used as an upper electrode of a storage capacitor. A portion of the gate line 12 is used as a lower electrode 12b of the storage capacitor.

A method of manufacturing a liquid crystal display unit according to the first embodiment of the present invention will now be described with reference to FIGS. 3a to 3d.

Figure 3A:
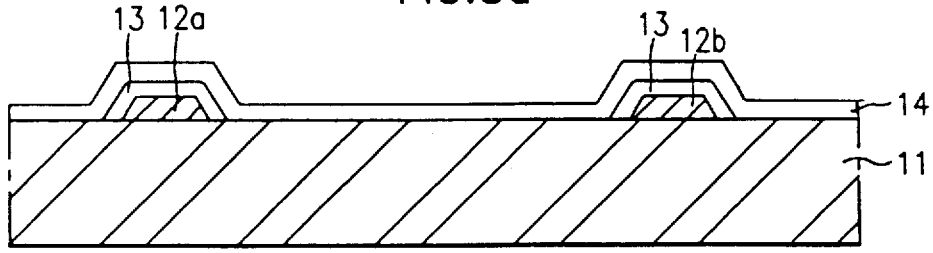
FIGS. 3a to 3d are sectional views showing a manufacturing process of a liquid crystal display unit, taken along line III–III' of FIG. 2.

As shown in FIG. 3a, a substrate 11 is prepared, and a metal layer is deposited on the substrate 11. The metal layer is selectively removed by a photolithographic and etching process to simultaneously form a gate line (not shown), a gate electrode 12a, and a storage capacitor lower electrode 12b. The gate electrode 12a and the storage capacitor lower electrode 12b are o subject to anodic oxidization to form an anodic oxide layer 13 on the exposed surface thereof.

Figure 3B:
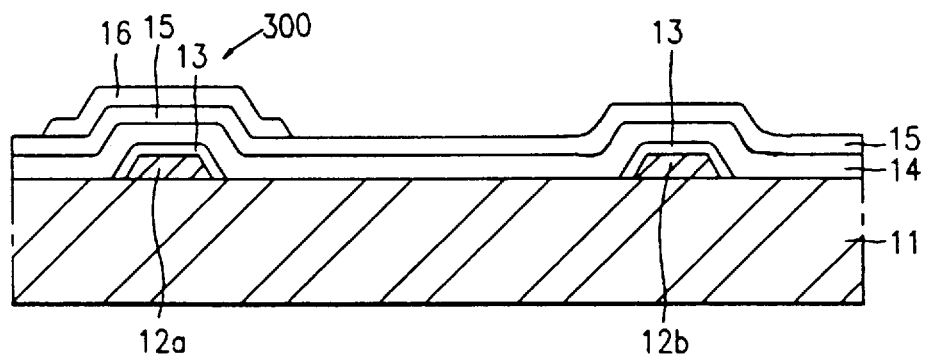

As shown in FIG. 3b, two different insulating layers, for example, $SiO_2$ and $Si_3N_4$ layers, or $Si_3N_4$ and $SiO_2$ layers, are sequentially deposited on the whole surface of the substrate 11 including the anodic oxide layer 13 to form first and second insulating layers 14 and 15. A semiconductor, such as amorphous silicon, is deposited on the first insulating layer 15 and selectively removed by the photolithographic and etching process to form a semiconductor layer 16.

Figure 3C:
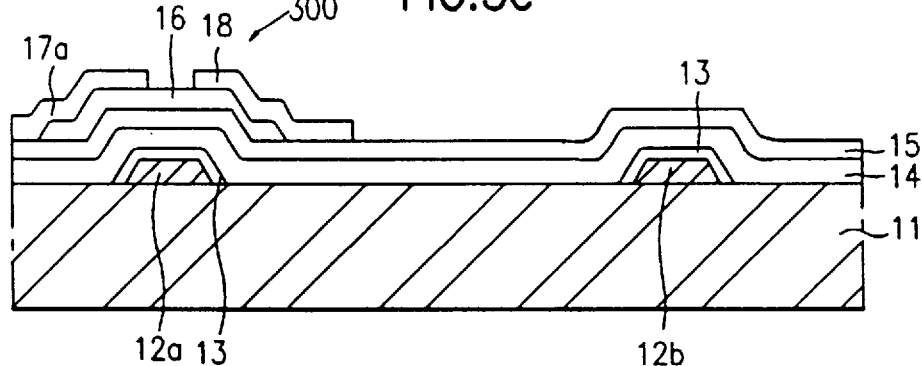

Next, as shown in FIG. 3c, a metal layer is deposited on the overall surface of the substrate 11 and selectively removed to form a source electrode 17a and a drain electrode 18. Thus, a transistor 300 of the liquid crystal display unit is formed.

Figure 3D:
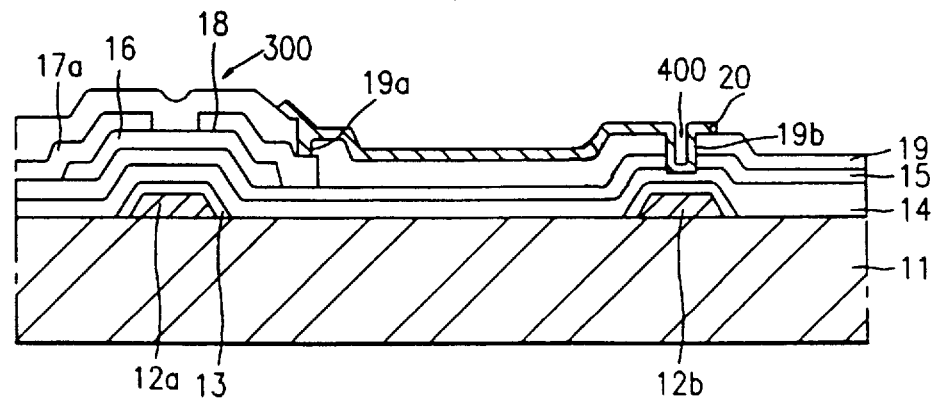

As shown in FIG. 3d, an insulating layer, for example, $SiO_2$ or $Si_3N_4$ layer, is deposited on the whole surface of the substrate 11 to form a third insulating layer 19 as a passivation layer. The third and second insulating layers 19 and 15 are selectively removed by the photolithographic and etching process to create first and second contact holes 19a and 19b and respectively expose a portion of the drain electrode 18 and a portion of the first insulating layer 14 which is located over the storage capacitor lower electrode 12b. Here, materials of the three insulating layers 14, 15 and 19, and the etching method are chosen such that the third and second insulating layers 19 and 15 have substantially larger etching rates than that of the first insulating layer 14. In other words, the etch selectivity of either the second or third insulating layer to the first insulating layer is high. Therefore, the third and second insulating layers 19 and 15 can be completely removed during the etching process without over-etching the first insulating layer 14.

Thereafter, a transparent conductive layer, such as an ITO layer, is deposited on the whole surface of the substrate 11 and selectively removed by the photolithographic and etching process to form a pixel electrode 20. Thus, a storage capacitor 400 is formed. Here, the pixel electrode 20 is electrically connected to the drain electrode 18 through the first contact hole 19a. The pixel electrode 20 formed in the second contact hole 19b is used as the upper electrode of the storage capacitor 400.

As previously mentioned, the distance between the capacitor lower electrode 12b and the pixel electrode 20 is shortened up to the thickness of the first insulating layer 14 and the anodic oxide layer 13. Thus, the distance between the upper and lower electrodes of the storage capacitor becomes much smaller than that of the storage capacitor in the conventional method. Accordingly, the storage capacitance in the present invention has a larger value than that in the conventional method.

FIGS. 4a to 4d show a method of manufacturing a liquid crystal display unit according to a second embodiment of the present invention.

Figure 4A:
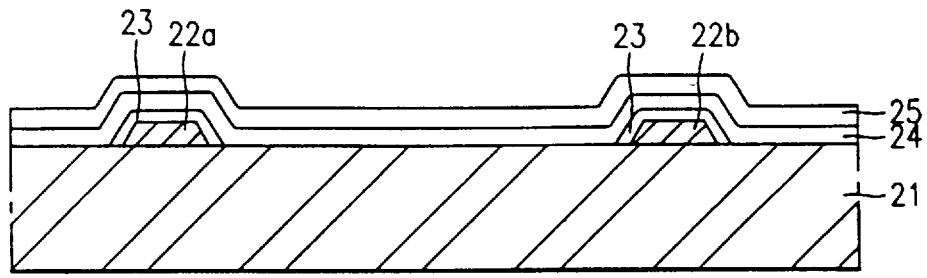
FIGS. 4a to 4d are sectional views showing a manufacturing process of a liquid crystal display unit according to a second embodiment of the present invention.

As shown in FIG. 4a, a metal layer is deposited on a substrate 21 and selectively removed by the photolithographic and etching process to form a gate line (not shown), a gate electrode 22a and a storage capacitor lower electrode 22b. The gate electrode 22a and the storage capacitor lower electrode 22b are subject to anodic oxidization to form an anodic oxide layer 23 on the exposed surface thereof. Two different insulating layers, such as $SiO_2$ and $Si_3N_4$ layers or $Si_3N_4$ and $SiO_2$ layers, are sequentially deposited on the whole surface of the substrate 21 including the anodic oxide layer 23 to form first and second insulating layers 24 and 25, respectively.

Figure 4B:
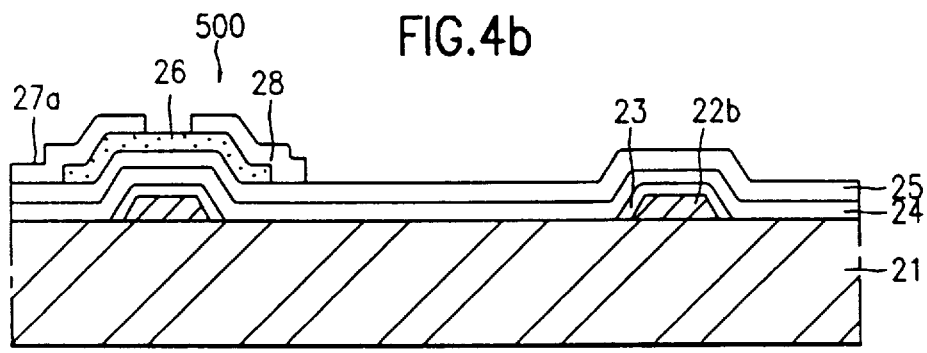

As shown in FIG. 4b, a semiconductor, such as amorphous silicon, is deposited on the second insulating layer 25 and selectively removed by the photolithographic and etching process to form a semiconductor layer 26. A metal layer is deposited on the exposed surface of the second insulating layer 25 including the semiconductor layer 26 and selectively removed to form a data line (not shown), a source electrode 27a and a drain electrode 28. A transistor 500 of the liquid crystal display unit is thus formed.

Figure 4C:
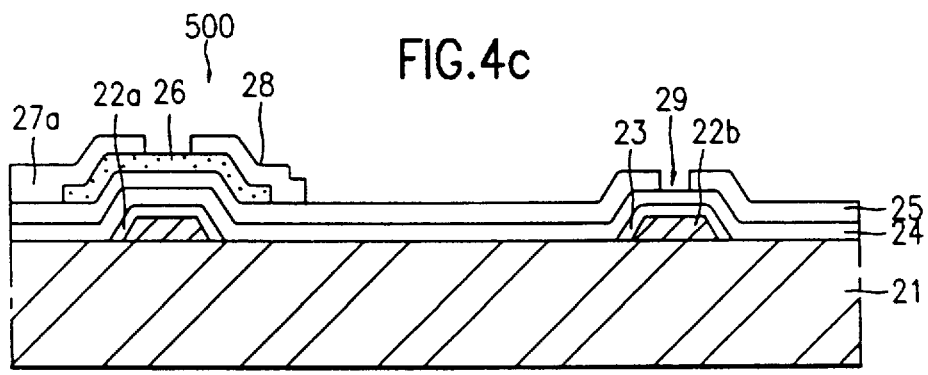

As shown in FIG. 4c, the second insulating layer 25 is selectively removed to form a contact hole 29 and expose a portion of the first insulating layer 24 located over the storage capacitor lower electrode 22b.

Figure 4D:
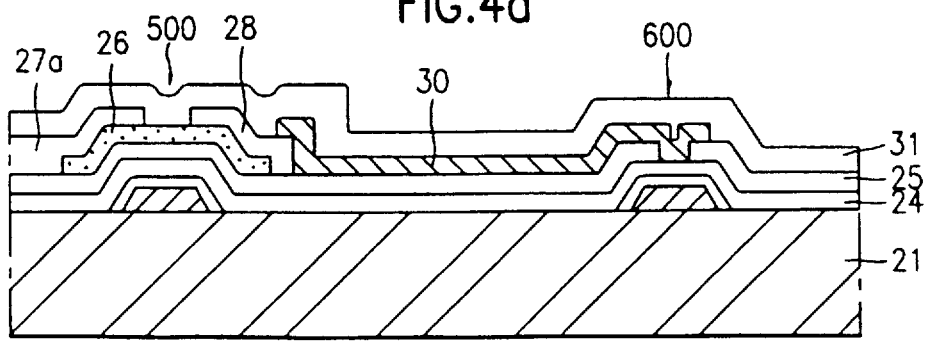

As shown in FIG. 4d, a transparent conductive layer, such as an ITO layer, is deposited on the whole surface of the substrate and selectively removed by the photolithographic and o etching process to form a pixel electrode 30. An insulating layer, such as an $Si_3N_4$ or an $SiO_2$ layer, is deposited on the whole surface of the substrate to form a passivation layer 31. A storage capacitor 600 of the liquid crystal display unit is thus formed.

A third embodiment of the present invention has a similar process as the second embodiment except that the order of the step for forming the pixel electrode and the step of forming the source and drain electrodes are interchanged. In particular, the pixel electrode is formed before forming the source and drain electrodes.

As is apparent from the aforementioned description, since one of the insulating layers between the upper and lower electrodes of the storage capacitor is selectively removed, the distance between the two electrode is shortened and the capacitance of the storage capacitor increases. Therefore, the present invention is suitable for high integration.

Also, in the present invention, combining two or more insulating layers having different energy band gaps ($\Delta E$ [$SiO_2$]≈8eV, $\Delta E$[$Si_3N_4$]≈4~5eV) are used to construct the gate insulating layer of the transistor. This can greatly reduce a leakage current through the gate insulating layer as compare with only one insulating layer.

Moreover, the manufacturing process of the present invention facilitates overcoming a stepped surface of the first insulating layer which helps to control and improve the interface characteristics. Thus, with respect to the manufacturing process, the process control is facilitated, thereby improving the manufacturing yield.

It will be apparent to those skilled in the art that various modifications and variations can be made in the liquid crystal display unit and manufacturing method of the present invention without departing from the spirit or scope of the invention. Thus, it is intended that the present invention cover the modifications and variations of this invention provided they come within the scope of the appended claims and their equivalents.

What is claimed is:

1. A capacitor for a liquid crystal display having a substrate, the capacitor comprising:
    a first electrode on the substrate;
    a first insulating layer over the first electrode;
    a second insulating layer immediately over the first insulating layer, the second insulating layer having a recess above the first electrode; and
    a second electrode over the second insulating layer including the recess.

2. A capacitor for a liquid crystal display according to claim 1, further comprising an oxidation layer on the first electrode below the first insulating layer.

3. A capacitor for a liquid crystal display according to claim 1, wherein the recess extends through the second insulating layer and exposes the first insulating layer so that the second electrode is over the exposed part of the first insulating layer.

4. A capacitor for a liquid crystal display according to claim 1, further comprising a third insulating layer over the second insulating layer and having a hole corresponding to the recess of the second insulating layer.

5. A capacitor for a liquid crystal display having a substrate, the capacitor comprising:
    a first electrode on the substrate;
    a first insulating layer over the first electrode;
    a second insulating layer over the first insulating layer, the second insulating layer having a recess above the first electrode;
    a third insulating layer over the second insulating layer, the third insulating layer having a hole at least substantially aligned with the recess of the second insulating layer; and
    a second electrode over the third insulating layer including the hole.

6. A capacitor for a liquid crystal display according to claim 5, further comprising an oxidation layer on the first electrode below the first insulation layer.

7. A capacitor for liquid crystal display according to claim 5, wherein the recess extends through the second insulating layer and exposes the first insulating layer so that the second electrode is over the exposed part of the first insulating layer.

8. A liquid crystal display including a transistor and a capacitor, the liquid crystal display comprising:
a substrate;
a gate electrode and a first capacitor electrode on the substrate;
a first insulating layer over the gate and the first capacitor electrode;
a second insulating layer over the first insulating layer;
a semiconductor layer on the second insulating layer above the gate electrode;
source and drain electrodes over the semiconductor layer;
a third insulating layer having a first hole over one of the source and drain electrodes, and the second and third insulating layers having a second hole above the first capacitor electrode;
a pixel electrode over the third insulating layer and contacting said one of the source and drain electrodes through the first hole; and
a second capacitor electrode over the third insulating layer including the second hole, the second capacitor electrode connected to the pixel electrode.

9. A liquid crystal display including transistor and a capacitor according to claim 8, wherein the pixel electrode and the second capacitor electrode are one conducting layer.

10. A capacitor for a liquid crystal display according to claim 1, wherein the second insulating layer has a higher etch selectivity than the first insulating layer.

11. A capacitor for a liquid crystal display according to claim 1, wherein the first and second insulating layers have different energy band gaps.

12. A capacitor for a liquid crystal display according to claim 5, wherein at least one of the second and third insulating layers has a higher etch selectivity than the first insulating layer.

13. A capacitor for a liquid crystal display according to claim 5, wherein at least two of the first, second, and third insulating layers have different energy band gaps.

14. A method of manufacturing a capacitor for a liquid crystal display having a substrate, comprising the steps of;
forming a first electrode on the substrate;
forming a first insulating layer over the first electrode;
forming a second insulating layer immediately over the first insulating layer, the second insulating layer having a recess above the first electrode; and
forming a second electrode over the second insulating layer including the recess.

15. A method of manufacturing a capacitor for a liquid crystal display according to claim 14, further comprising the step of forming an oxidation layer on the first electrode below the first insulating layer.

16. A method of manufacturing a capacitor for a liquid crystal display according to claim 14, wherein the recess extends through the second insulating layer and exposes the first insulating layer so that the second electrode is over the exposed part of the first insulating layer.

17. A method of manufacturing a capacitor for a liquid crystal display according to claim 14, further comprising the step of forming a third insulating layer over the second insulating layer and having a hole corresponding to the recess of the second insulating layer.

18. A method of manufacturing a capacitor for a liquid crystal display according to claim 14, wherein the second insulating layer has a higher etch selectivity than the first insulating layer.

19. A method of manufacturing a capacitor for a liquid crystal display according to claim 14, wherein the first and second insulating layers have different energy band gaps.

20. A method of manufacturing a capacitor for a liquid crystal display having a substrate, the method comprising the steps of:
forming a first electrode on the substrate;
forming a first insulating layer over the first electrode;
forming a second insulating layer over the first insulating layer, the second insulating layer having a recess above the first electrode;
forming a third insulating layer over the second insulating layer, the third insulating layer having a hole at least substantially aligned with the recess of the second insulating layer; and
forming a second electrode over the third insulating layer including the hole.

21. A method of manufacturing a capacitor for a liquid crystal display according to claim 20, further comprising the step of forming an oxidation layer on the first electrode below the first insulation layer.

22. A method of manufacturing a capacitor for a liquid crystal display according to claim 20, wherein the recess extends through the second insulating layer and exposes the first insulating layer so that the second electrode is over the exposed part of the first insulating layer.

23. A method of manufacturing a capacitor for a liquid crystal display according to claim 20, wherein at least one of the second and third insulating layers has a higher etch selectivity than the first insulating layer.

24. A method of manufacturing a capacitor for a liquid crystal display according to claim 20, wherein at least two of the first, second, and third insulating layers have different energy band gaps.

25. A method of manufacturing a liquid crystal display including a transistor and a capacitor, the method comprising the steps of:
forming a gate electrode and a first capacitor electrode on the substrate;
forming a first insulating layer over the gate and the first capacitor electrode;
forming a second insulating layer over the first insulating layer;
forming a semiconductor layer on the second insulating layer above the gate electrode;
forming source and drain electrodes over the semiconductor layer;
forming a third insulating layer having a first hole over one of the source and drain electrodes, and the second and third insulating layers having a second hole above the first capacitor electrode;
forming a pixel electrode over the third insulating layer and contacting said one of the source and drain electrodes through the first hole; and
forming a second capacitor electrode over the third insulating layer including the second hole, the second capacitor electrode connected to the pixel electrode.

26. A method of manufacturing a liquid crystal display including a transistor and a capacitor according to claim 25, wherein the pixel electrode and the second capacitor electrode are one conducting layer.

* * * * *